(12) United States Patent
Pereira

(10) Patent No.: US 6,191,969 B1
(45) Date of Patent: *Feb. 20, 2001

(54) SELECTIVE MATCH LINE DISCHARGING IN A PARTITIONED CONTENT ADDRESSABLE MEMORY ARRAY

(75) Inventor: Jose Pio Pereira, Santa Clara, CA (US)

(73) Assignee: Net Logic Microsystems, Inc., Mountain View, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/392,972

(22) Filed: Sep. 9, 1999

(51) Int. Cl.[7] .............................. G06F 12/02; G11C 7/00
(52) U.S. Cl. ...................... 365/49; 365/204; 365/189.07; 365/202
(58) Field of Search ................................ 365/49, 189.01, 365/189.05, 189.07, 202, 204

(56) References Cited

U.S. PATENT DOCUMENTS

| | | | |
|---|---|---|---|
| 4,862,412 | * 8/1989 | Fried et al. | 365/49 |
| 5,319,589 | * 6/1994 | Yamagata et al. | 365/49 |
| 5,327,372 | * 7/1994 | Oka et al. | 315/49 |
| 5,339,268 | * 8/1994 | Machida | 365/49 |
| 5,394,353 | * 2/1995 | Nusinov et al. | 365/49 |
| 5,446,685 | * 8/1995 | Holst | 365/49 |
| 5,467,319 | * 11/1995 | Nusinov et al. | 365/231 |
| 5,483,480 | 1/1996 | Yoneda | 365/49 |
| 5,517,441 | 5/1996 | Dietz et al. | 365/49 |
| 5,598,115 | * 1/1997 | Holst | 326/119 |
| 5,619,446 | * 4/1997 | Yoneda et al. | 365/49 |
| 5,726,942 | * 3/1998 | Yoneda et al. | 365/208 |
| 5,754,463 | * 5/1998 | Henstrom et al. | 365/49 |
| 5,859,791 | * 1/1999 | Schultz et al. | 365/49 |
| 5,890,201 | * 3/1999 | McLellan et al. | 711/108 |
| 5,907,867 | * 5/1999 | Shinbo et al. | 711/207 |
| 5,978,246 | 11/1999 | Shindo | 365/49 |
| 6,081,441 | * 6/2000 | Ikoda | 365/49 |

* cited by examiner

Primary Examiner—Viet Q. Nguyen
(74) Attorney, Agent, or Firm—William L. Paradice, III

(57) ABSTRACT

Rows of a CAM array are partitioned into a plurality of row segments, with each row segment having a number of CAM cells coupled to a corresponding match line segment. Each CAM cell includes a discharge circuit connected between the cell and ground potential. The discharge circuits connected to CAM cells in a row segment each include a control terminal coupled to receive a control signal indicative of the logical state of the match line segment of the preceding row segment. During compare operations, all match line segments are pre-charged toward a supply voltage. If there is a match in a first row segment, the first match line segment remains charged and, in response thereto, the discharge circuits within a subsequent row segment are turned on to allow the subsequent match line segments to indicate match conditions in the subsequent row segment. On the other hand, if there is a mismatch condition in the first row segment, thereby discharging the first match line segment, the discharge circuits in the subsequent row segment turn off to prevent corresponding match line segments in subsequent row segments from discharging.

15 Claims, 4 Drawing Sheets

SELECTIVE MATCH LINE DISCHARGING IN A PARTITIONED CONTENT ADDRESSABLE MEMORY ARRAY

CROSS-REFERENCE TO RELATED APPLICATION

This application is related to the commonly owned U.S. patent application Ser. No. 09/391,989 entitled "SELECTIVE MATCH LINE PRE-CHARGING IN A PARTITIONED CONTENT ADDRESSABLE MEMORY ARRAY," filed on the same day as the present application.

BACKGROUND

1. Field of Invention

This invention relates generally to semiconductor memories and specifically to content addressable memories.

2. Description of Related Art

A CAM includes an array of memory cells arranged in a matrix of rows and columns. Each memory cell stores a single bit of digital information, i.e., either logic zero or logic one. The bits stored within a row of memory cells constitute a CAM word. During compare operations, a comparand word is received at appropriate input terminals of the CAM and then compared with all the CAM words. For each CAM word that matches the comparand word, a corresponding match line signal is asserted to indicate a match condition. When there is a match condition, the index or address of the matching CAM word is read from the CAM. Associative information stored in, for instance, an associated RAM, may also be provided.

FIG. 1 shows a typical CAM row 1 as having n CAM cells 10(1)–10(n) each coupled to an associated match line ML. A pull-up transistor 12, coupled between a supply voltage $V_{DD}$ and match line ML, has a gate tied to ground potential, and therefore remains in a conductive state. Prior to each compare operation between an n-bit comparand word and an n-bit CAM word stored in CAM cells 10(1)–10(n), match line ML is pre-charged to supply voltage $V_{DD}$ via pull-up transistor 12. The n-bits of the comparand word are compared with corresponding bits of the CAM word in respective CAM cells 10(1)–10(n). If all bits of the comparand word match corresponding bits of the CAM word, the match line ML remains charged to indicate a match condition. Conversely, if one of the comparand bits does not match the corresponding CAM bit, the CAM cell 10 storing that CAM bit discharges match line ML toward ground potential to indicate a mismatch condition.

As described above, the match lines in a CAM array are typically pre-charged to the supply voltage $V_{DD}$ for each and every compare operation. Thus, for each mismatch condition, an associated match line ML is first charged toward $V_{DD}$ and then discharged toward ground potential. Current flow associated with this charging and discharging results in undesirable power consumption. Further, as the number of CAM cells in each row of a CAM array increases, capacitive loading on the match lines increases accordingly. As loading on the match lines increases, the current required to charge the match lines toward the supply voltage increases. Accordingly, as CAM words are widened, for example, to accommodate longer Internet addresses, power consumption resulting from charging the match lines during compare operations may significantly increase. It is therefore desirable to reduce power consumption during compare operations.

SUMMARY

A method and apparatus are disclosed that may reduce power consumption associated with pre-charging match lines in a content addressable memory (CAM) during compare operations. In accordance with one embodiment of the present invention, each row of a CAM array is partitioned into a plurality of row segments, with each row segment having a number of CAM cells coupled to a corresponding match line segment. Each CAM cell is coupled to ground potential through a corresponding discharge circuit. The discharge circuits corresponding to CAM cells in each row segment are responsive to match conditions in a preceding row segment. The discharge circuits in the first row segment are responsive to a disable signal.

During compare operations between a comparand word and CAM words stored in corresponding rows of the CAM array, all match line segments in the corresponding rows are pre-charged toward a supply voltage to enable evaluation of match conditions therein. For each row segment, if there is a match between corresponding bits of the comparand and CAM words, the CAM cells in the segment maintain the corresponding match line segment in the charged state to indicate the match condition. In response thereto, the discharge circuits corresponding to a subsequent row segment turn on to allow the subsequent match line segment to reflect match conditions in the subsequent row segment. On the other hand, if there is a mismatch condition in the row segment, the CAM cells and discharge circuits therein discharge the match line segment toward ground potential. In response to this mismatch condition, the discharge circuits in the subsequent row segment(s) turn off to prevent discharging of the subsequent match line segment(s), thereby preventing match conditions in the subsequent row segment(s) from affecting a match signal for the row. Here, the mismatch condition of the preceding row segment may be propagated along the row to indicate a mismatch condition for the row without discharging subsequent match line segments. When the subsequent match line segments remain in the charged state, they may not need to be pre-charged for the next compare operation. As a result, power consumption associated with match line pre-charging may be reduced in subsequent compare operations.

BRIEF DESCRIPTION OF THE DRAWINGS

Like reference numerals refer to corresponding parts throughout the drawing figures.

DETAILED DESCRIPTION

Embodiments of the present invention are discussed below in the context of a CAM architecture 20 for simplicity only. It is to be understood that embodiments of the present invention are equally applicable to other content addressable memories having other configurations and/or employing any suitable CAM cells including, for example, ternary CAM cells. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Figure 1:
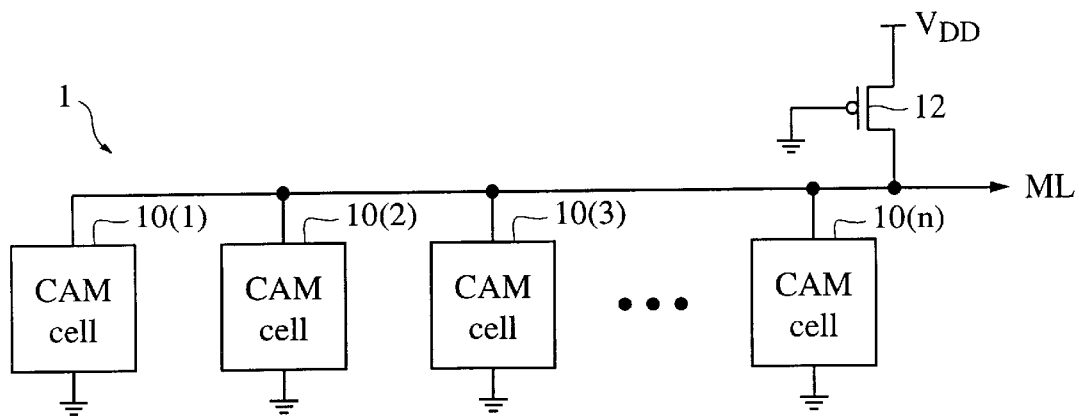
FIG. 1 is a block diagram of a row of a typical CAM array.
Figure 2:
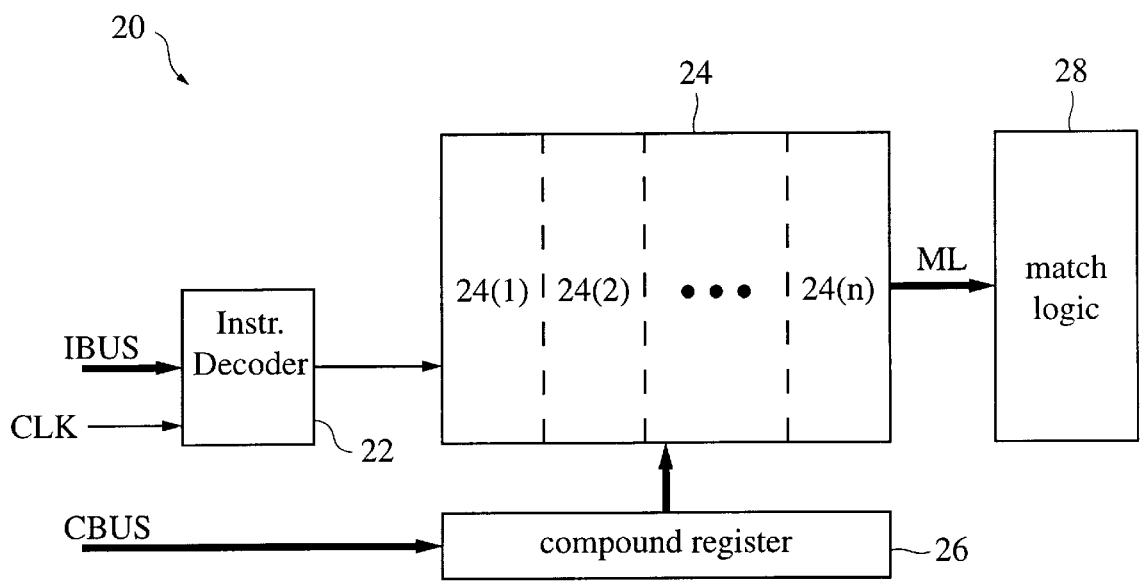
FIG. 2 is a block diagram of a CAM architecture in accordance with one embodiment of the present invention.

FIG. 2 shows a CAM architecture 20 in accordance with one embodiment of the present invention including an instruction decoder 22, a CAM array 24, a comparand register 26, and match logic 28. Instruction decoder 22 decodes instructions received from an instruction bus IBUS and, in response thereto, provides control signals to CAM array 24 (e.g., via write and/or read circuitry not shown). A comparand word to be compared with data words stored in corresponding rows of CAM array 24 is received on a comparand bus CBUS and thereafter provided directly to CAM array 24, or provided to CAM array 24 via the comparand register 26. For compare operations, one or more bits of the comparand word may be globally masked by mask data stored in one or more registers (not shown), or locally masked. During compare operations, each row of CAM array 24 provides a match signal to match logic 28 via match lines ML to indicate whether a match condition exists for the row. Match logic 28 may output one or more flag signals including a single match flag, a multiple match flag, and/or a full flag signal. The match lines may also be provided to an encoder such as a priority encoder.

CAM array 24 includes a plurality of CAM cells arranged in rows and columns. The rows of CAM array 24 are divided into a plurality of row segments 24(1)–24(n), each including any suitable number of CAM cells. Each row segment 24(1)–24(n) includes an associated match line segment, and the CAM cells within each row segment are connected to the associated match line segment (for simplicity, match line segments are not shown in FIG. 2). In some embodiments, the row segments each include the same number of CAM cells, while in other embodiments the row segments include different numbers of CAM cells. CAM array 24 includes any type of CAM cells including any type of binary or ternary CAM cells.

Figure 3:
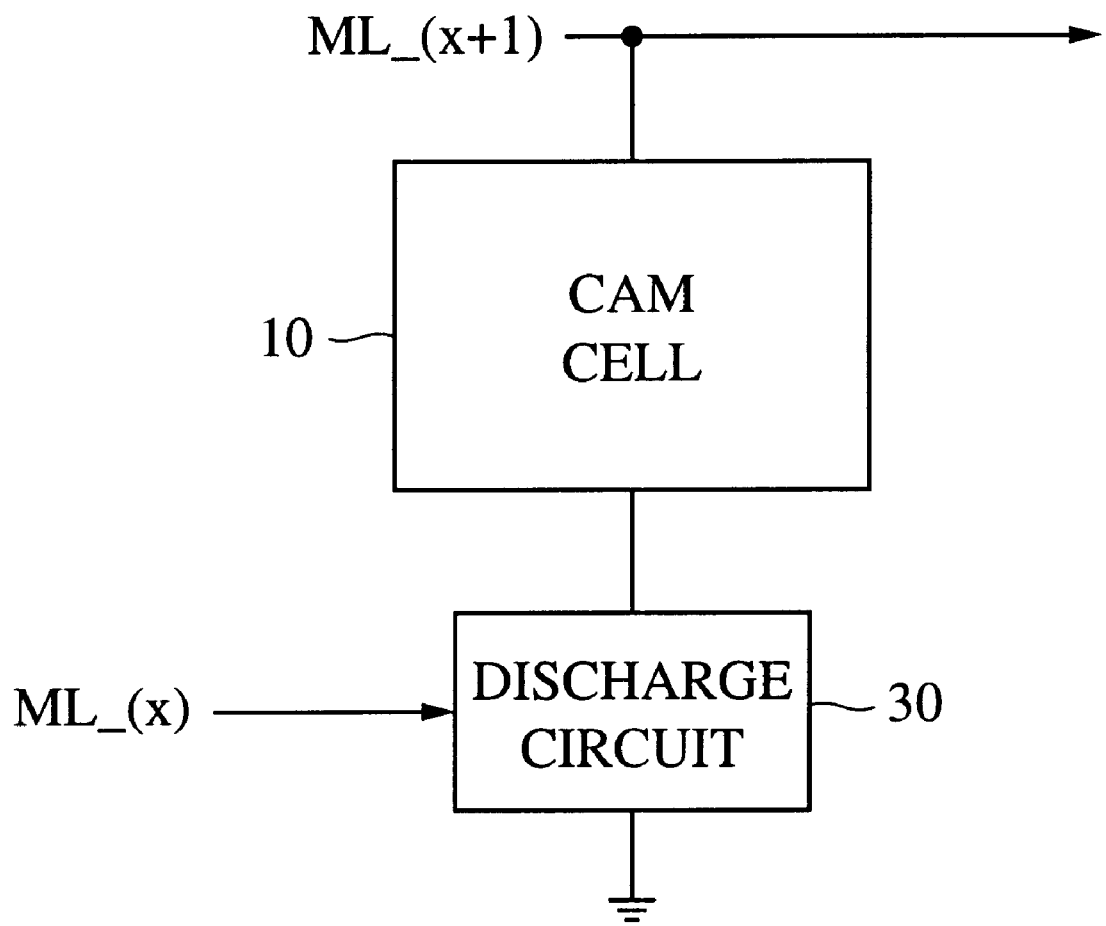
FIG. 3 is a block diagram of a CAM cell and discharge circuit of one embodiment of FIG. 2.

Referring also to FIG. 3, in accordance with the present invention, a discharge circuit 30 is connected in series with each CAM cell 10 in array 24 between a match line segment and ground potential. A control terminal of each discharge circuit 30 in a row segment is coupled to the match line segment (or a derivative thereof) of a preceding row segment. During a compare operation, all match line segments within each row of CAM array 24 selected for comparison with a comparand word are pre-charged toward a supply voltage $V_{DD}$ to enable detection of match conditions therein. A comparand word received by comparand register 26 is compared with CAM words stored in selected rows of CAM array 24. If there is a match condition within a first row segment of array 24, discharge circuits 30 in a subsequent row segment are turned on to allow match conditions therein to influence the logic state of the match signal for the row. On the other hand, if there is a mismatch condition in the first row segment, discharge circuits 30 in the subsequent row segment are turned off to prevent discharge of the match line segment of the subsequent row segment. This can save power associated with the discharge of these match line segments. The incremental enabling/disabling of the ability to discharge match line segments in response to mismatch conditions in preceding row segments continues until either (1) all row segments indicate match conditions, in which case a match condition exists for the row, or (2) a mismatch condition is detected, in which case the mismatch condition is propagated along the row to indicate a mismatch condition for the row without discharging subsequent match line segments. Since the subsequent match line segments remain charged, and therefore do not need to be pre-charged for the next compare operation, power consumption associated with pre-charging the subsequent match line segments may be nearly eliminated.

For another embodiment, one or more CAM cells may share one or more discharge circuits in a row segment. For example, one discharge circuit 30 may be used for an entire row segment.

Figure 4:
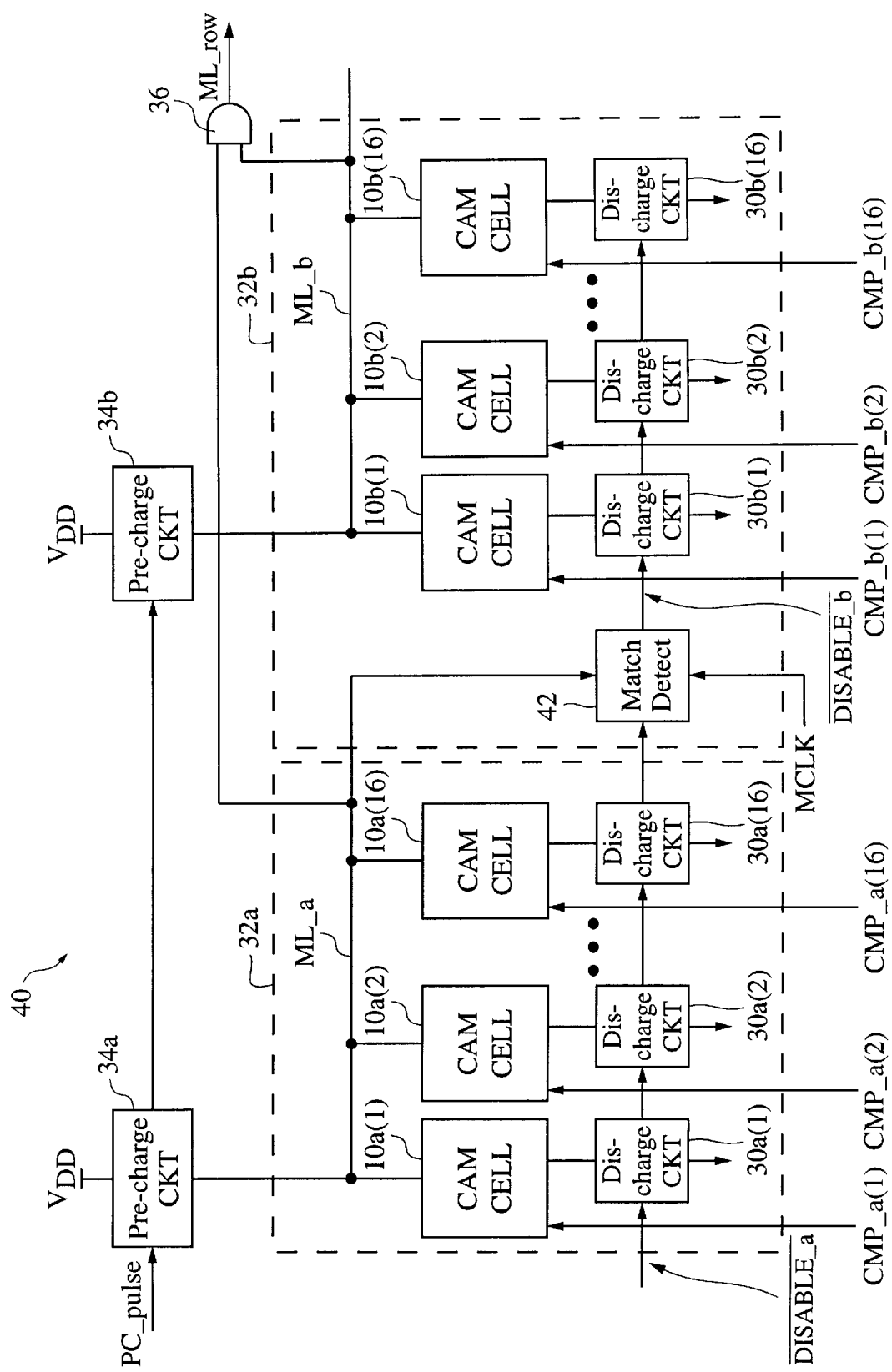
FIG. 4 is a block diagram of one embodiment of a row of the CAM architecture of FIG. 2 employing the CAM cell and discharge circuit of FIG. 3.

FIG. 4 shows a 32-bit row 40 in accordance with one embodiment of CAM architecture 20. Row 40 includes two row segments 32a and 32b. Row segment 32a includes sixteen CAM cells 10a(1)–10a(16) each coupled to associated first match line segment ML_a and each receiving one bit of comparand data CMP_a(1)–CMP_a(16), respectively. Second row segment 32b includes sixteen CAM cells 10b(1)–10b(16) each coupled to associated second match line segment ML_b and each receiving one bit of comparand data CMP_b(1)–CMP_b(16), respectively. Word lines(s) and bit line(s) have been omitted from FIG. 4 for simplicity. For alternative embodiments, each row segment may include any number (i.e., the same or different) of CAM cells coupled to one or more discharge circuits.

The logic state of first match line segment ML_a is indicative of match conditions within first row segment 32a, and the logic state of second match line segment ML_b is indicative of match conditions within second row segment 32b when discharge circuits 30b are enabled. Each CAM cell 10a within first row segment 32a is coupled to ground potential through a corresponding discharge circuit 30a having a control terminal to receive a disable signal $\overline{\text{DISABLE\_a}}$. In some embodiments, $\overline{\text{DISABLE\_a}}$ is provided by instruction decoder 22 (e.g., in response to detecting/decoding a compare instruction). In other embodiments $\overline{\text{DISABLE\_a}}$ is a clock signal. For an alternate embodiment, $\overline{\text{DISABLE\_a}}$ and discharge circuits 30a may be omitted from the first row segment 32a.

CAM cells 10b within second row segment 32b are coupled to ground potential through corresponding discharge circuits 30b. Row segment 32b also includes match detect circuit 42. Match detect circuit 42 provides $\overline{\text{DISABLE\_b}}$ to discharge circuits 30b in response to ML_a, MCLK, and $\overline{\text{DISABLE\_a}}$ MCLK is a clock signal (or other timed signal) that is provided to indicate when match detect circuit 42 outputs $\overline{\text{DISABLE\_b}}$ to discharge circuits 30b. MCLK may be provided by instruction decoder 22 or by a clock circuit (not shown) coupled to instruction decoder 22 and/or clock signal CLK. For an alternate embodiment, match detect circuit 42 may be omitted, and ML_a connected to each of discharge circuits 30b.

First match line segment ML_a is pre-charged to a supply voltage $V_{DD}$ by a first pre-charge circuit 34a, and second match line segment ML_b is pre-charged to $V_{DD}$ by a second pre-charge circuit 34b. Pre-charge circuits 34a and 34b are responsive to a pre-charge pulse PC_ pulse. For this embodiment, circuitry for generating multiple pre-charge pulses for individual row segments may not be required. For other embodiments, pre-charge circuits 34a and 34b each have their own pre-charge signal, or receive no pre-charge signal at all. Respective logic states of first and second match line segments ML_a and ML_b are logically combined in an AND gate 36 to provide a match line signal ML_row indicative of the match condition for row 40. Other logic gates may be used to provide a desired state for ML_row in response to ML_a and ML_b.

During compare operations, first and second match line segments ML_a and ML_b are pre-charged to $V_{DD}$ to enable detection of match conditions therein. $\overline{\text{DISABLE}}$_a is in a logic high state to turn on discharge circuits 30a in first row segment 32a, and to turn off discharge circuits 30b in second row segment 32b (via match detect circuit 42 and $\overline{\text{DISABLE}}$_b). For each CAM cell 10a in first row segment 32a, if there is a match condition with the corresponding bit of the comparand word, CAM cell 10a and discharge circuit 30a does not discharge first match line segment ML_a toward ground potential. Thus, if all bit comparisons in first row segment 32a match, first match line segment ML_a remains in a charged state to indicate the match condition. In response to the match condition in first row segment 32a, match detect circuit 42 drives $\overline{\text{DISABLE}}$_b to a logic high state after receiving MCLK. MCLK is timed to be asserted after sufficient time has passed to resolve the logical state of ML_a. When $\overline{\text{DISABLE}}$_b is high, discharge circuits 30b within second row segment 32b turn on to allow for match conditions in second row segment 32b to affect ML_b. If all bit comparisons in second row segment 32b match, second match line segment ML_b remains charged. In response to the charged (e.g. logic high) state of first and second match line segments ML_a and ML_b, AND gate 36 drives signal ML_row to logic high to indicate a match condition for row 40. If any of the bit comparisons in second row segment 32b mismatch, second match line segment ML_b is discharged toward ground potential through the corresponding CAM cell 10b and discharge circuit 30b. The resulting logic low state of second match line segment ML_b forces signal ML_row to logic low, thereby indicating a mismatch condition for row 40.

If any of the bit comparisons in first row segment 32a mismatch, one or more corresponding CAM cells 10a discharge first match line segment ML_a toward ground potential through one or more corresponding discharge circuits 30a. In response to the mismatch condition in the first row segment 32a, match detect logic circuit 42 asserts $\overline{\text{DISABLE}}$_b to a low logic state such that discharge circuits 30b turn off to prevent match line segment ML_b from discharging. The discharged state (e.g., logic low) of first match line segment ML_a propagates through AND gate 36 to force ML_row to logic low, thereby indicating a mismatch condition for row 40 without discharging subsequent match line segments. This saves power associated with discharging ML_b. Also, since second match line segment ML_b is maintained in its charged state, it need not be precharged for the next compare operation. Accordingly, power consumption associated with pre-charging second match line segment ML_b is saved during the next compare operation.

Power savings realized by present embodiments are proportional to the number of row segments in the CAM array and to the frequency with which mismatch conditions are detected in early row segments. For instance, where each CAM row is partitioned into two segments of equal bit lengths, as shown in FIG. 4, not having to discharge second match line segment ML_b may reduce power consumption associated with match line discharging by as much as 50%. Accordingly, when employed in applications which typically result in mismatch conditions in the first row segment, present embodiments may achieve significant power savings.

Power savings may be increased by increasing the number of row segments in CAM array 24. For example, where array 24 includes four row segments, a mismatch condition in the first row segment prevents discharging of the three subsequent match line segments, and therefore only one of the four match line segments needs to be pre-charged for the next compare operation. Here, power consumption associated with match line discharging (and pre-charging in the next compare operation) may be reduced by as much as 75%. In this example, since there are four row segments, the corresponding four match line segments may be connected to corresponding input terminals of a four-input AND gate (or its equivalent), which in turn provides match conditions for the row (e.g., signal ML_row).

The compare operation performed on row 40 can resolve ML_row in one or more clock cycles of CLK.

Figure 5:
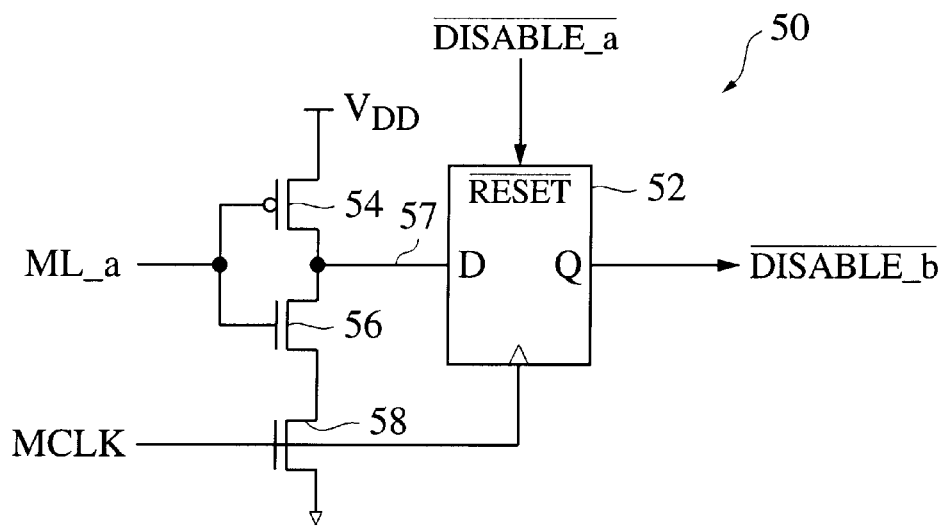
FIG. 5 is a circuit diagram of one embodiment of the match detect circuit of FIG. 4.

FIG. 5 shows match detect circuit 50, which is one embodiment of match detect circuit 42 of FIG. 4. Match detect circuit 50 includes flip-flop 52, PMOS transistor 54, and NMOS transistors 56 and 58. Transistors 54, 56, and 58 are connected in series between $V_{DD}$ and ground potential to form a clocked inverter. Transistors 54 and 56 are configured as a CMOS inverter having ML_a coupled to their gates, and their drains coupled to the D input of flip-flop 52 at node 57. Transistor 58 is coupled in series between the source of transistor 56 and ground potential, and has its gate coupled to receive MCLK. Flip-flop 52 is clocked by MCLK, has its $\overline{\text{RESET}}$ input coupled to receive $\overline{\text{DISABLE}}$_a, and provides $\overline{\text{DISABLE}}$_b from its $\overline{Q}$ output. When $\overline{\text{DISABLE}}$_a is in a low logic state, flip-flop 52 is reset such that $\overline{\text{DISABLE}}$_b is set to a low logic state, and discharge circuits 30b are disabled from discharging match line segment ML_b. When $\overline{\text{DISABLE}}$_a is in a high logic state, the logical complement of the logic state at node 57 is provided to discharge circuits 30b when MCLK transitions to a logic high state. The clocked CMOS inverter formed by transistors 54, 56, and 58 discharges node 57 only when ML_a is in a high logic state and MCLK transitions to a high state. Thus, $\overline{\text{DISABLE}}$_b is driven to a logic high state to enable discharge circuits 30b when ML_a is in a high logic state and MCLK transitions to a high state.

Figure 6:
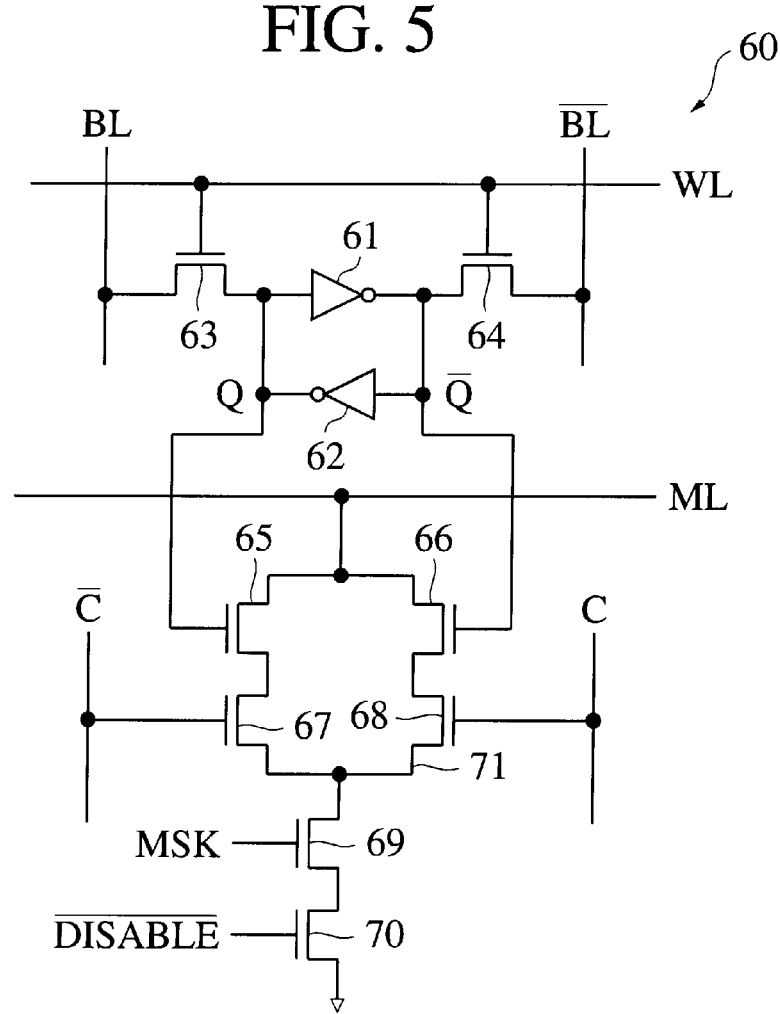
FIG. 6 is a circuit diagram of the CAM cell and discharge circuit of FIG. 3 in one embodiment of the present invention.

In some embodiments, discharge circuits 30 may each be one or more MOS transistors coupled between a corresponding CAM cell and ground potential, or coupled between the match line and the CAM cell. For example, FIG. 6 shows a CAM cell 60 that is one embodiment of a ternary CAM cell coupled to an NMOS discharge transistor 70. NMOS transistor 70 is one embodiment of the discharge circuit 30 of FIG. 3. Other embodiments may be used to discharge match line ML. Other embodiments of binary or ternary CAM cells may also be used.

Cell 60 includes a latch formed by inverters 61 and 62 for storing a corresponding bit of a data word. Opposite sides of the latch are coupled to associated complementary bit lines BL and $\overline{\text{BL}}$ via pass transistors 63 and 64, respectively, where each such pass transistor has a gate coupled to associated word line WL. The output terminal of inverter 62 provides associated data bit Q to the gate of an NMOS pass transistor 65, and the output terminal of inverter 61 provides the complementary data bit $\overline{Q}$ to the gate of an NMOS pass transistor 66. Pass transistor 65 is coupled between match line ML and the drain of NMOS transistor 67. Transistor 67 has its gate coupled to receive complementary comparand data bit $\overline{C}$, and its source coupled to node 71. Pass transistor 66 is coupled between ML and the drain of NMOS transistor 68. Transistor 68 has its gate coupled to receive comparand data bit C, and its source coupled to node 71.

Mask transistor 69 and discharge transistor 70 are connected in series between node 71 and ground potential. The gate of mask transistor 69 receives mask signal MSK that is used to mask the comparison results determined by transistors 65–68 from influencing the logical state of ML. The gate of discharge transistor 70 receives $\overline{\text{DISABLE}}$. As shown, discharge transistor 70 will not discharge node 71 or ML if $\overline{\text{DISABLE}}$ is logic low. Only when the comparand data does not match the data stored in the CAM cell (and MSK is logic high), will discharge transistor 70 discharge ML to ground potential when $\overline{\text{DISABLE}}$ is in a logic high state.

Discharge circuit 30 may be any suitable structure that selectively prevents discharging of corresponding match line segments. Thus, for example, in one embodiment each row segment may include a single discharge circuit having a first terminal coupled to each of the CAM cells in the row segment, a second terminal coupled to ground potential, and a control terminal coupled to a preceding match line segment (e.g., through a match detect circuit). In other embodiments, discharge circuits 30 may be implemented using logic.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A content addressable memory (CAM) including a plurality of rows, each of the rows comprising:
    a first row segment having a plurality of CAM cells coupled to a first match line segment;
    a second row segment having:
        a plurality of CAM cells coupled to a second match line segment;
        a plurality of discharge circuits, each coupled in series with a corresponding CAM cell in the second row segment between the second match line segment and a predetermined potential; and
        a match detect circuit coupled between the first match line segment and the plurality of discharge circuits in the second row segment.

2. The CAM of claim 1, wherein the predetermined potential is ground potential.

3. The CAM of claim 1, wherein the discharge circuits, in response to match conditions in the first row segment, prevent corresponding CAM cells in the second row segment from discharging the second match line segment.

4. The CAM of claim 1, wherein the discharge circuits prevent discharging of the second match line segment when there is mismatch condition in the first row segment.

5. The CAM of claim 1, wherein the match detect circuit comprises:
    a clocked inverter circuit having a first input coupled to the first match line segment, a second input coupled to a clock signal, and an output; and
    a storage element having an input coupled to the output of the clocked inverter circuit, and an output coupled to the discharge circuits.

6. The CAM of claim 1, wherein at least one of the discharge circuits comprises a transistor having a first terminal coupled to the corresponding CAM cell, a second terminal coupled to the predetermined potential, and a gate coupled to the match detect circuit.

7. The CAM of claim 1, further comprising a plurality of second discharge circuits connected to corresponding ones of the first CAM cells in the first row segment, the second discharge circuits each having a control terminal to receive a disable signal.

8. The CAM of claim 7, wherein the second discharge circuits prevent discharging of the first match line segment in response to the disable signal.

9. The CAM of claim 1, further comprising a first pre-charge circuit coupled to the first match line segment.

10. The CAM of claim 9, further comprising a second pre-charge circuit coupled to the second match line segment.

11. The CAM of claim 1, wherein each row further comprises a logic circuit coupled to the first match line segment and the second match line segment, the logic circuit to output a match signal for the row.

12. The CAM of claim 11, wherein logic circuit is an AND gate.

13. A content addressable memory (CAM) structure comprising:
    a CAM cell having a first terminal coupled to an associated match line segment indicative of match conditions in a corresponding row segment; and
    a discharge circuit coupled in series with the CAM cell between the match line segment and a predetermined potential, the discharge circuit responsive to match conditions in a preceding row segment.

14. The CAM structure of claim 13, wherein the discharge circuit comprises an MOS transistor having a first terminal coupled to the CAM cell, a second terminal coupled to ground potential, and a control terminal coupled to receive a control signal indicative of match conditions in a preceding row segment.

15. The CAM structure of claim 13, wherein the discharge circuit comprises an MOS transistor having a first terminal coupled to the CAM cell, a second terminal coupled to ground potential, and a control terminal coupled to a match line segment of a preceding row segment.

* * * * *